(12) United States Patent
Zhang et al.

(10) Patent No.: US 10,497,869 B2
(45) Date of Patent: Dec. 3, 2019

(54) PHASE CHANGE MEMORY AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Chao Zhang, Shanghai (CN); Ru Ling Zhou, Shanghai (CN); Qing Yong Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/919,537

(22) Filed: Mar. 13, 2018

(65) Prior Publication Data
US 2018/0269393 A1  Sep. 20, 2018

(30) Foreign Application Priority Data
Mar. 17, 2017  (CN) .......................... 2017 1 0160215

(51) Int. Cl.
*H01L 29/02*  (2006.01)
*H01L 47/00*  (2006.01)
*H01L 45/00*  (2006.01)

(52) U.S. Cl.
CPC .......... *H01L 45/1286* (2013.01); *H01L 45/06* (2013.01); *H01L 45/126* (2013.01); *H01L 45/1233* (2013.01); *H01L 45/1293* (2013.01); *H01L 45/144* (2013.01); *H01L 45/1608* (2013.01); *H01L 45/1625* (2013.01); *H01L 45/1675* (2013.01)

(58) Field of Classification Search
CPC ............... H01L 45/1286; H01L 45/126; H01L 45/1675; H01L 45/144; H01L 45/1293; H01L 45/1233; H01L 45/06; H01L 45/1625; H01L 45/1608
See application file for complete search history.

(56) References Cited

U.S. PATENT DOCUMENTS

| | | | | |
|---|---|---|---|---|
| 5,933,365 A * | 8/1999 | Klersy | ..................... | G11C 11/56 257/2 |
| 7,321,130 B2 * | 1/2008 | Lung | .................... | H01L 27/2436 257/4 |
| 7,547,913 B2 * | 6/2009 | Yoon | ....................... | H01L 45/06 257/42 |
| 7,939,815 B2 * | 5/2011 | Lee | ..................... | H01L 27/2427 257/13 |
| 8,022,382 B2 * | 9/2011 | Lai | ......................... | H01L 45/06 257/3 |

(Continued)

*Primary Examiner* — Ismail A Muse
(74) *Attorney, Agent, or Firm* — Anova Law Group, PLLC

(57) ABSTRACT

A phase change memory and a fabrication method are provided. The fabrication method includes: providing a substrate; forming a heating layer on the substrate; forming a phase change layer on and in contact with one sidewall surface of the heating layer. The phase change memory includes: a substrate; a heating layer on the substrate; and a phase change layer on and in contact with one sidewall surface of the heating layer.

20 Claims, 5 Drawing Sheets

(56) References Cited

U.S. PATENT DOCUMENTS

| | | | |
|---|---|---|---|
| 2005/0110983 A1* | 5/2005 | Jeong | H01L 45/1666 356/148 |
| 2005/0255665 A1* | 11/2005 | Pellizzer | G11C 11/56 438/400 |
| 2007/0045606 A1* | 3/2007 | Magistretti | H01L 45/06 257/4 |
| 2007/0075347 A1* | 4/2007 | Lai | H01L 45/06 257/296 |
| 2007/0148814 A1* | 6/2007 | Pellizzer | H01L 27/2445 438/102 |
| 2007/0181867 A1* | 8/2007 | Hewak | G11B 7/243 257/4 |
| 2008/0185575 A1* | 8/2008 | Hsiung | G11C 11/56 257/4 |
| 2010/0155688 A1* | 6/2010 | Bakkers | H01L 45/06 257/4 |
| 2010/0163828 A1* | 7/2010 | Tu | H01L 45/144 257/3 |
| 2010/0177559 A1* | 7/2010 | Chen | G11C 11/5678 365/163 |
| 2011/0065252 A1* | 3/2011 | Nakamura | H01L 27/2436 438/382 |
| 2011/0070715 A1* | 3/2011 | Karpov | G11C 11/5678 438/382 |
| 2011/0223716 A1* | 9/2011 | Lee | H01L 45/06 438/102 |
| 2011/0237045 A1* | 9/2011 | Bez | G11C 11/5678 438/382 |
| 2012/0001145 A1* | 1/2012 | Magistretti | H01L 27/2445 257/4 |
| 2012/0112154 A1* | 5/2012 | Breitwisch | H01L 45/06 257/4 |
| 2013/0175493 A1* | 7/2013 | Song | H01L 45/06 257/3 |
| 2013/0200328 A1* | 8/2013 | Lee | H01L 45/06 257/4 |
| 2013/0284998 A1* | 10/2013 | Lazzari | H01L 45/06 257/2 |
| 2014/0133222 A1* | 5/2014 | Hewak | G11B 7/243 365/163 |
| 2015/0090954 A1* | 4/2015 | Li | H01L 45/06 257/4 |
| 2015/0221863 A1* | 8/2015 | Song | H01L 45/06 257/4 |
| 2015/0263088 A1* | 9/2015 | Cheng | H01L 29/0673 257/20 |
| 2015/0349049 A1* | 12/2015 | Mao | H01L 28/60 257/532 |
| 2016/0104528 A1* | 4/2016 | Colombo | B32B 7/02 365/163 |
| 2019/0140175 A1* | 5/2019 | Hinsinger | H01L 45/1293 |

* cited by examiner

PHASE CHANGE MEMORY AND FABRICATION METHOD THEREOF

CROSS-REFERENCES TO RELATED APPLICATIONS

This application claims the priority of Chinese patent application No. 201710160215. 3, filed on Mar. 17, 2017, the entirety of which is incorporated herein by reference.

FIELD OF THE DISCLOSURE

The present disclosure generally relates to the field of semiconductor manufacturing technologies and, more particularly, relates to a phase change memory and a fabrication method thereof.

BACKGROUND

With the development of information technologies, the amount of information that needs to be stored increases dramatically. The increase in the amount of the stored information promotes rapid development of the phase change memory, and also sets higher requirements for the read/write efficiency of the phase change memory.

Phase change memory (PCM) is a memory device that stores data by making use of the conductivity difference of a special material when converting between the crystalline and the amorphous states.

The basic structure of a memory cell of the PCM includes a phase change layer. The phase change layer is made of a small chalcogenide alloy, which, through central heating by an electrical pulse, can switch quickly from an ordered crystalline state to a disordered amorphous state. The electrical resistance of the amorphous state is much higher than the resistance of the crystalline state. The phase change memory stores the binary data by the difference in the magnitude of the resistivity between the crystalline and the amorphous states of the phase change layer. Specifically, the amorphous state with a higher resistance is used to store the binary "0" and the crystalline state with a lower resistance store "1". The repetitive conversion of the phase change layer of a phase change memory from the crystalline state to the amorphous state is triggered by a melting and rapid cooling mechanism.

However, the conventional phase change memory has drawbacks of slow read/write speed and low read/write efficiency. The disclosed phase change memory and fabrication method are directed to solve one or more problems set forth above and other problems.

BRIEF SUMMARY OF THE DISCLOSURE

One aspect of the present disclosure includes a method of fabricating a phase change memory. The fabrication method includes: providing a substrate; forming a heating layer on the substrate; and forming a phase change layer on and in contact with one sidewall surface of the heating layer.

Another aspect of the present disclosure includes a phase change memory. The phase change memory includes: a substrate; a heating layer on the substrate; and a phase change layer on and in contact with one sidewall surface of the heating layer.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

The present disclosure provides a phase change memory and the fabrication method thereof to increase the read/write speed and improve the performance of the phase change memory.

For example, a phase change memory may be fabricated by: forming a heating layer on a substrate; forming a phase change layer on one sidewall surface of the heating layer. in one embodiment, only one sidewall surface of the heating layer is in contact with the phase change layer. The thickness of the heating layer may be made smaller than the minimum size of the heating layer when forming the heating layer. As such, the contact area between the phase change layer and the heating layer can be made sufficiently small, and only a small portion of the phase change layer material undergoes a phase change when the data are read and written. Therefore, the phase change time can be shortened and the read/write speed of the phase change memory can be increased.

Figure 1:
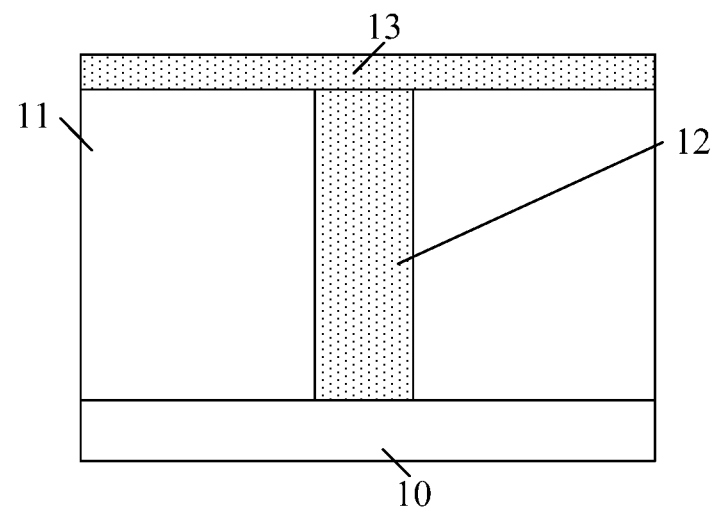
FIG. 1 illustrates a schematic structural view of a phase change memory corresponding to certain stages of the fabrication process.

FIG. 1 illustrates a schematic structural view of a phase change memory. As shown in FIG. 1, the process of forming a phase change memory includes: providing a substrate 10; forming a dielectric layer 11 on the substrate 10; forming a heating structure 12 in the dielectric layer 11, the dielectric layer 11 exposing the heating structure 12; and forming a phase change layer 13 on the heating structure 12.

The contact surface between the heating structure 12 and the phase change layer 13 is parallel to the surface of the substrate 10. The dielectric layer 11 and the heating structure 12 are formed by the following processes: forming an initial dielectric layer on the substrate 10; etching the initial dielectric layer to form a dielectric layer 11 and an opening in the dielectric layer 11; and forming a heating structure 12 in the opening. During the etching process of the initial dielectric layer, the size of the opening along the direction parallel to the surface of the substrate 10 is difficult to be reduced due to limitations of the processing accuracy, resulting in a relatively large size of the formed heating structure 12 along the direction parallel to the surface of the substrate 10. It is also difficult to reduce the size of the phase change material along the direction parallel to the surface of the substrate 10 due to limitations of the processing accuracy, thereby causing a large contact area between the heating structure 12 and the phase change layer 13. The contact area between the heating structure 12 and the phase change layer 13 is relatively large and a large amount of the material in the phase change layer 12 changes phase when reading data, leading to a relatively long phase changing time of the phase change layer 12 in the vicinity of the contact area between the phase change layer 13 and the heating structure 12, and thus leading to a slow read/write speed of the phase change memory.

The present disclosure provides a method of forming a phase change memory, which includes: providing a substrate; forming a heating layer on the substrate; forming a phase change layer on and in contact with one sidewall surface of the heating layer.

As disclosed, a phase change layer is formed on the sidewall surface of the heating layer. In the process of forming the heating layer, the thickness of the heating layer can be made relatively small, smaller than the minimum size of the surface of the heating layer. Because the thickness of the heating layer is relatively small, and also because the phase change layer is located on the sidewall surface of the heating layer and only the sidewall of the heating layer is in contact with the phase change layer, the contact area between the phase change layer and the heating layer is relatively small. Since the contact area between the phase change layer and the heating layer is relatively small and only a small amount of the material of the phase change layer undergoes phase change when reading and writing data, the phase change time can be shortened, thereby increasing the read/write speed of the phase change memory.

Figure 9:
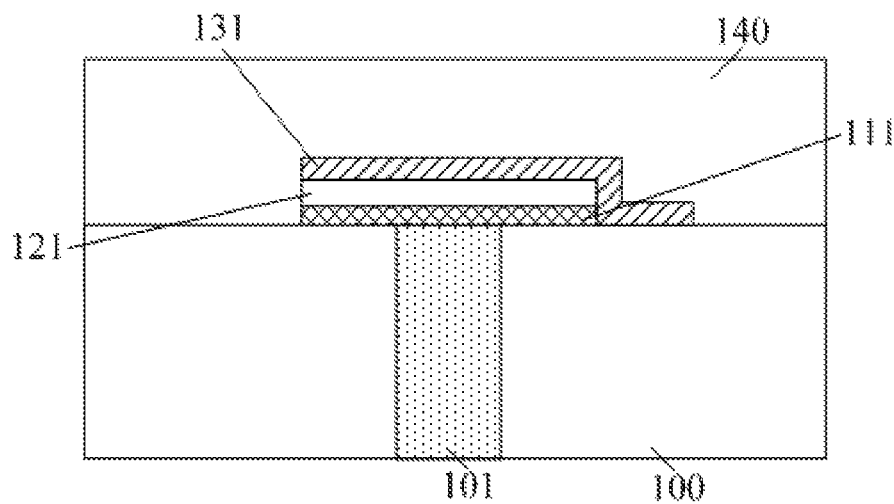
Figure 10:
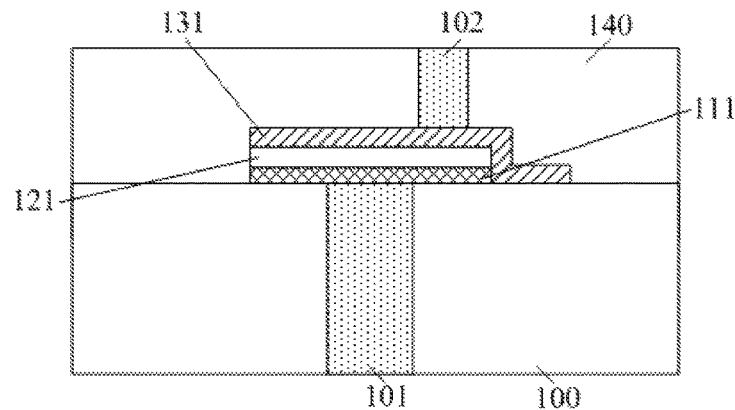
Figure 11:
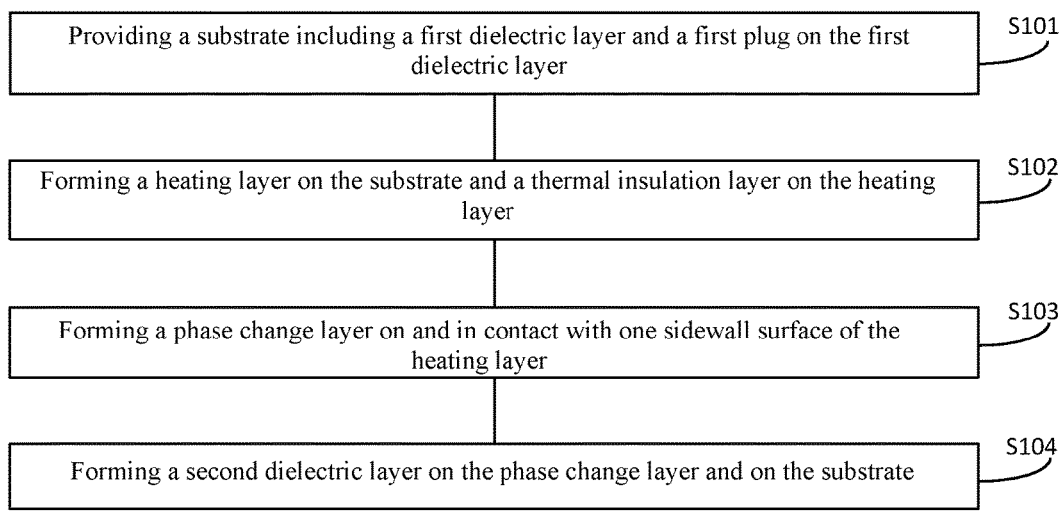
FIG. 11 illustrates an exemplary fabricating process of a phase change memory consistent with the disclosed embodiment.

FIG. 11 illustrates an exemplary fabrication process of a phase change memory consistent with the disclosed embodiments; and FIGS. 2-10 illustrate schematic structural views of a phase change memory corresponding to certain stages of the exemplary fabrication process consistent with the disclosed embodiments.

Figure 2:
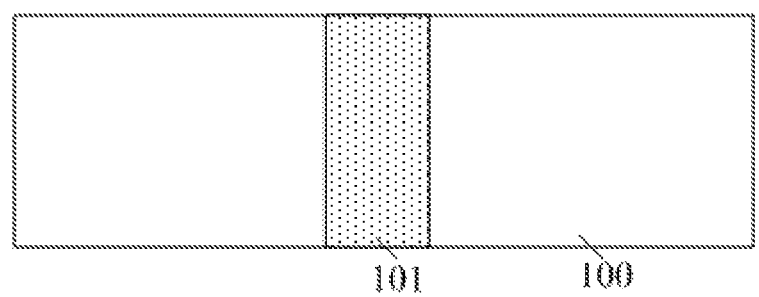
FIGS. 2-10 illustrate schematic structural views of a phase change memory corresponding to certain stages of a fabrication process consistent with the disclosed embodiment.

As shown in FIG. 11, at the beginning of the fabrication process, a substrate is provided (S101). As shown in FIG. 2, a substrate is provided.

In one embodiment, the substrate includes a first dielectric layer 100 and a first plug 101 in the first dielectric layer 100. The first plug 101 penetrates through the first dielectric layer 100 along the surface normal direction of the first dielectric layer 100.

The first plug 101 is used to electrically connect the first plug 101 and the external circuit; and the first dielectric layer is used to electrically isolating the first plug 101 and the external circuit.

In one embodiment, the first dielectric layer 100 is made of silicon oxide. In another embodiment, the first dielectric layer may also be made of silicon oxynitride.

In one embodiment, the first plug 101 is made of tungsten. In another embodiment, the first plug may also be made of copper.

Returning to FIG. 11, after providing the substrate, the fabrication method further includes forming a heating layer on the substrate and a thermal insulation layer on the heating layer (S102).

A heating layer is formed subsequently on the substrate. In one embodiment, the fabrication method further includes forming a thermal insulation layer on the substrate. The thermal insulation layer is located on the heating layer, and the thermal insulation layer exposes the sidewall of the heating layer.

In one embodiment, the heating layer and the thermal insulation layer are formed by the processes illustrated in FIGS. 3 to 6.

Figure 3:
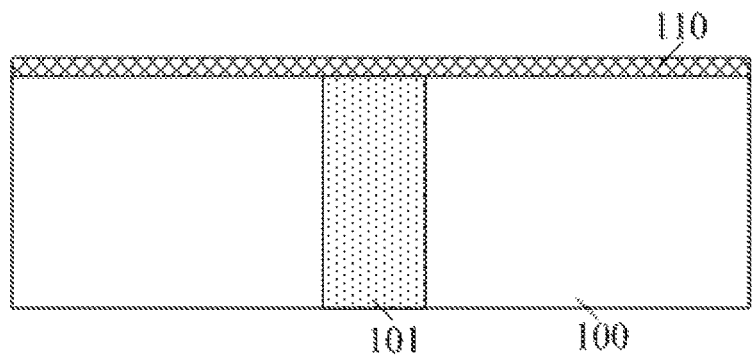

As shown in FIG. 3, an initial heating layer 110 is formed on the substrate.

The initial heating layer 110 is used to subsequently form a heating layer to heat the subsequently formed phase change layer, such that the phase change layer changes phase and the resistance of the phase change layer is changed to store the data.

The initial heating layer 110 is in contact with the first plug 101.

In one embodiment, the initial heating layer 110 is made of titanium nitride, titanium, tungsten, tantalum or tantalum nitride.

In one embodiment, the process of forming the initial heating layer 110 includes a physical vapor deposition process.

In one embodiment, the thickness of the initial heating layer 110 determines the thickness of the subsequently formed heating layer and further determines the contact area between the subsequently formed phase change layer and the heating layer, thereby affecting the read/write speed of the formed phase change memory. The smaller the thickness of the initial heating layer 110, the smaller the contact area between the subsequently formed phase change layer and the heating layer, and the less material of the phase change layer changes phase when storing data. Also, the phase change speed is faster and the read/write speed of the phase change memory is faster.

If the thickness of the initial heating layer 110 is too large, the contact area between the subsequently formed phase change layer and the heating layer is relatively large, which is not good for increasing the read/write speed of the phase change memory; if the thickness of the initial heating layer 110 is too small, the processing difficulty will be easily increased. In one embodiment, the thickness of the initial heating layer 110 is in a range of 60 nm to 80 nm.

Figure 4:
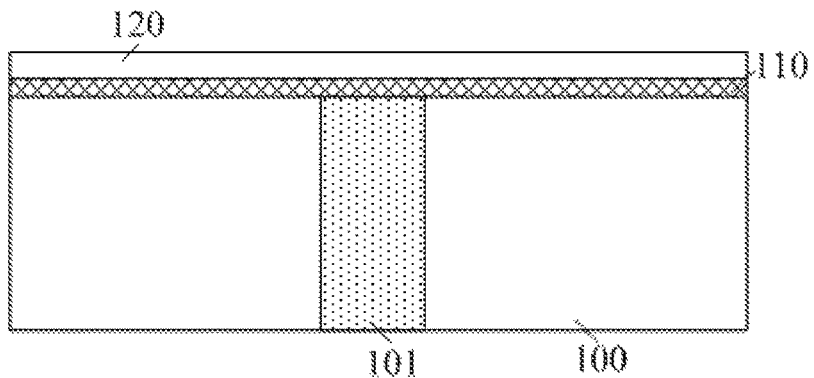

As shown in FIG. 4, an initial thermal insulation layer 120 is formed on the initial heating layer 110.

The initial thermal insulation layer 120 is used to subsequently form a thermal insulation layer.

In one embodiment, the initial thermal insulation layer 120 is made of silicon nitride. In other embodiments, the initial thermal insulation layer may also be made of silicon oxynitride.

In one embodiment, the process of forming the initial thermal insulation layer 120 includes a chemical vapor deposition process. In other embodiments, the process of forming the initial thermal insulation layer may also include a physical vapor deposition process.

If the thickness of the initial thermal insulation layer 120 is too large, it can easily increase the difficulty of subsequently etching the initial thermal insulation layer 120; if the thickness of the initial thermal insulation layer 120 is too small, it is not easy to thermally isolate the subsequently formed heating layer and the phase change layer. In one embodiment, the thickness of the initial thermal insulation layer 120 is in a range of 600 Å to 800 Å.

Figure 5:
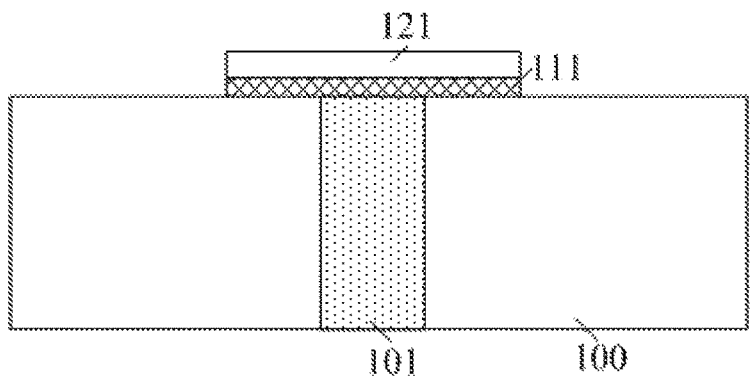
Figure 6:
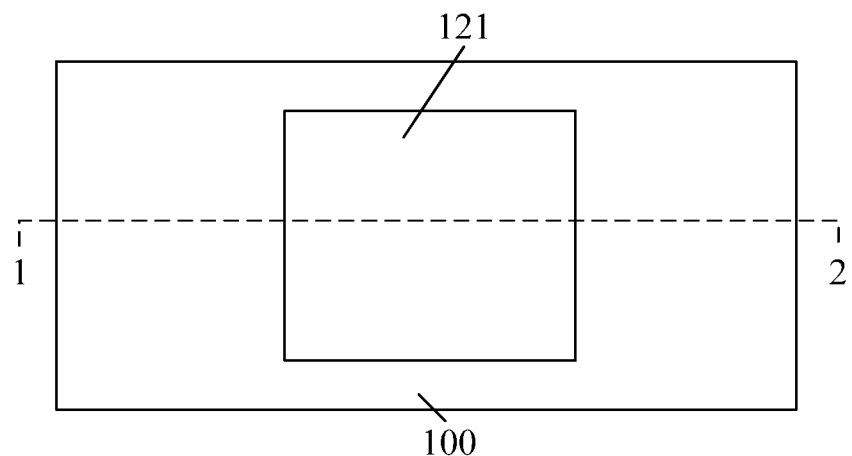

FIG. 5 illustrates a cross-sectional view of the semiconductor structure as shown in FIG. 6, along the cutting line 1-2.

As shown, the initial thermal insulation layer 120 (shown in FIG. 4) and the initial heating layer 110 (as shown in FIG. 4) are patterned to respectively form a heating layer 111 and a thermal insulation layer 121 on the heating layer 111.

The heating layer 111 is used to heat the subsequently formed phase change layer, so that the phase change layer change phase and the resistance of the phase change layer is changed, which is used for storing data. The thermal insulation layer 121 is used to thermally isolate the heating layer 111 and the subsequently formed phase change layer.

The process of patterning the initial thermal insulation layer 120 and the initial heating layer 110 includes: forming a patterned mask layer on the initial thermal insulation layer 120; and using the mask layer as a mask to etch the initial thermal insulation layer 120 and the initial heating layer 110 to form a heating layer 111 and a thermal insulation layer 121 on the heating layer 111.

In one embodiment, the mask layer is made of a photoresist.

In one embodiment, the process of etching the initial thermal insulation layer 120 and the initial heating layer 110 includes a dry etching process. In other embodiments, the process of etching the initial thermal insulation layer and the initial heating layer includes a wet etching process.

The width of the formed thermal insulation layer 121 and the heating layer 111 cannot be easily reduced due to the limitations of the etching process, and the thickness of the initial heating layer 111 is smaller than the width of the thermal insulation layer 121 and the heating layer 111.

In one embodiment, the projected pattern of the thermal insulation layer 121 and the heating layer 111 on the surface of the substrate is a square, and the side length of the projected pattern of the thermal insulation layer 121 and the heating layer 111 on the surface of the substrate is in a range of 250 nm to 350 nm. In other embodiments, the projected pattern of the thermal insulation layer and the heating layer on the surface of the substrate may also be a rectangle or a circle.

Returning to FIG. 18, after forming the heating layer and the thermal insulation layer, the fabrication method further includes forming a phase change layer (S103).

A phase change layer is then formed on the sidewall surface of the heating layer 111, and only the sidewall of the heating layer 111 is in contact with the phase change layer.

Figure 7:
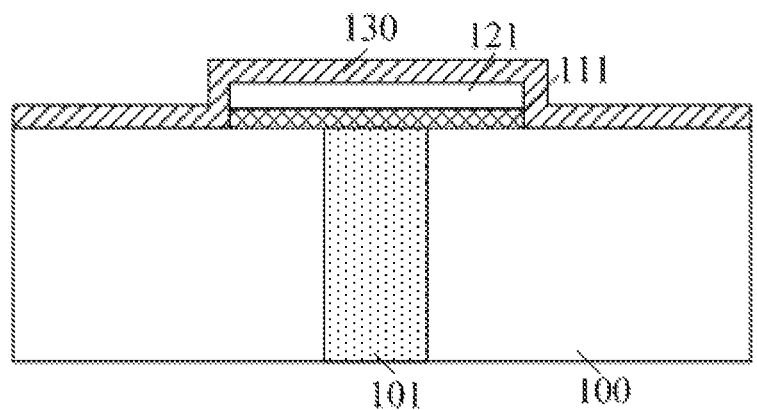
Figure 8:
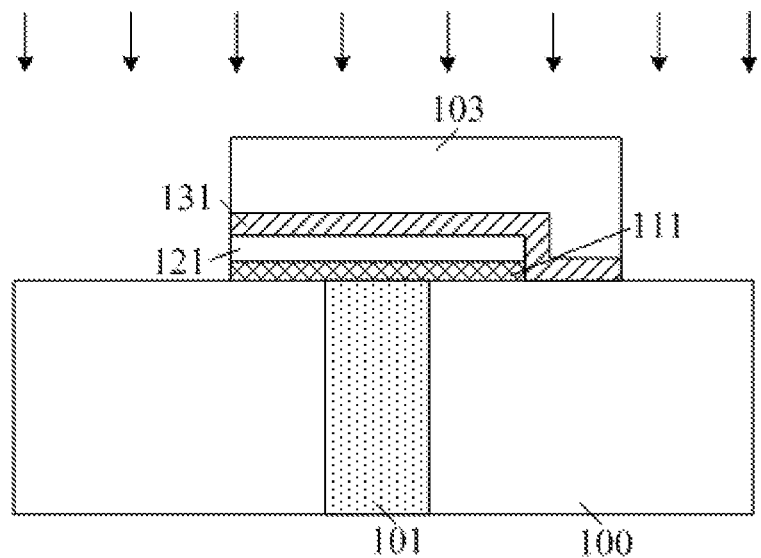

In one embodiment, the process of forming the phase change layer is shown in FIGS. 7 and 8.

As shown in FIG. 7, an initial phase change layer 130 is formed on the thermal insulation layer 121 and on the sidewall surface of the heating layer 111.

The initial phase change layer 130 is used to subsequently form a phase change layer.

In one embodiment, the initial phase change layer 130 is made of GeSbTe (GST).

In one embodiment, the GST material has both crystalline and amorphous phases. When the temperature of GST is higher than the recrystallization temperature and lower than the melting temperature, the GST material can easily crystallize to form a crystalline state. The crystalline GST has a longer range of atomic energy levels and a higher density of electrons, resulting in a lower electrical resistivity. When the temperature of GST is greater than the melting temperature and the GST material is suddenly quenched and cooled, the GST material can easily turn into amorphous. The amorphous GST has a shorter range of atomic energy levels and a lower density of free electrons, leading to a larger electrical resistivity. Therefore, the temperature of the subsequently formed phase change layer can be controlled by the heating layer, such that GST can be switched between the crystalline state and the amorphous state, thereby storing the binary data "1" or "0".

In one embodiment, the process of forming the initial phase change layer 130 includes a physical vapor deposition process.

If the thickness of the initial phase change layer 130 is too small, the processing difficulty of forming the initial phase change layer 130 can be easily increased; and if the thickness of the initial phase change layer 130 is too large, it is easy to increase the difficulty of the subsequent etching process. In one embodiment, the thickness of the initial phase change layer 130 is in a range of 700 Å to 1000 Å.

As shown in FIG. 8, the initial phase change layer 130 (shown in FIG. 7) is etched to remove a portion of the initial phase change layer 130 from one of the sidewall surfaces of the heating layer 111, thereby forming a phase change layer 131 on the other sidewall surface.

The phase change layer 131 is used to store the binary data.

Because the contact area between the phase change layer 131 and the heating layer 111 is relatively small and the phase change layer 131 is located on the sidewall surface of the heating layer 111, the contact area between the phase change layer 131 and the heating layer 111 is very small. Since the contact area between the phase change layer 131 and the heating layer is very small and only a small portion of the phase change layer 131 undergoes phase change when reading and writing data, the phase change time can be shortened and the read/write speed of the phase change memory can be increased.

In one embodiment, the phase change layer 131 and the initial phase change layer 130 are made of the same material. For example, the phase change layer 131 is made of GST (GeSbTe).

In one embodiment, the process of removing a portion of the initial phase change layer 130 on one sidewall surface of the heating layer 111 includes forming a patterned layer 103 covering the initial phase change layer 130, with the patterned layer 103 exposing a portion of the initial phase change layer 130 on one sidewall surface of the heating layer 111. The patterned layer 103 is partially overlapped with the projected pattern of the heating layer 111 on the substrate. The initial phase change layer 130 is etched using the patterned layer 103 as a mask. The patterned layer 103 is then removed after etching the initial phase change layer 130.

Etching the initial phase change layer 130 and removing a portion of the initial phase change layer 130 on one sidewall surface of the heating layer 111 can further reduce the contact area between the phase change layer 131 and the heating layer 111, thereby further increasing the read/write speed of the phase change memory. In other embodiments, the process of forming the phase change layer may include removing portions of the initial phase change layer 130 on the substrate 100, while the remaining initial phase change layer may be on all sidewall surfaces of the phase change layer. In other words, the formed phase change layer may cover all sidewall surfaces of the heating layer.

In one embodiment, the patterned layer 103 covers the initial phase change layer 130 on three sidewall surfaces of the heating layer 111, exposing the initial phase change layer 130 on one sidewall surface of the heating layer 111. Thus, the phase change layer 131 is located on the three sidewall surfaces of the heating layer 111 and on the thermal insulation layer 121. In other embodiments, the phase change layer may also be located on one or two sidewall surfaces of the heating layer.

In one embodiment, the process of etching the initial phase change layer 130 may include a dry etching process or a wet etching process.

Returning to FIG. 18, after forming the phase change layer, the fabrication method further includes forming a second plug connecting the phase change layer 131 (S104).

In one embodiment, the process of forming the second plug is shown in FIGS. 9 and 10.

As shown in FIG. 9, a second dielectric layer 140 is formed on the phase change layer 131 and on the substrate 100.

The second dielectric layer 140 is used to electrically insulate the subsequently formed second plug and the external circuit.

In one embodiment, the second dielectric layer 140 is made of silicon oxide or silicon oxynitride.

In one embodiment, the process of forming the second dielectric layer 140 includes a chemical vapor deposition process. In other embodiments, the process of forming the second dielectric layer may also be a physical vapor deposition process or an atomic layer deposition process.

As shown in FIG. 10, a second plug 102 is formed in the second dielectric layer 140, and the second plug 102 is connected to the phase change layer 131.

The second plug 102 is used to electrically connect the phase change layer 131 with the external circuit.

In one embodiment, the process of forming the second plug 102 in the second dielectric layer 140 includes forming a plug hole in the second dielectric layer 140, with the plug hole exposing the phase change layer 131; and forming a second plug 102 in the plug hole.

In one embodiment, the second plug 102 is made of tungsten. In other embodiments, the second plug may also be made of aluminum.

In one embodiment, the process of forming the second plug 102 includes a chemical vapor deposition process or a physical vapor deposition process.

In the method of forming the phase change memory provided in the disclosure, a phase change layer is formed on the sidewall surface of the heating layer, and the thickness of the heating layer can be made very small in the process of forming the heating layer, smaller than the minimum size of the surface of the heating layer. Since the thickness of the heating layer is small and the phase change layer is located on the sidewall surface of the heating layer, the contact area between the phase change layer and the heating layer can be made small. The phase change layer has a small contact area with the heating layer, and only a small portion of the phase change layer undergoes phase change when reading and writing data, so that the phase change time can be shortened, thereby increasing the read/write speed of the phase change memory.

Further, removing a portion of the initial phase change layer on the sidewall surface of the heating layer can further reduce the contact area between the heating layer and the phase change layer, thereby further improving the read/write speed.

Accordingly, the present disclosure also provides a phase change memory.

As shown in FIG. 10, the phase change memory provided in the disclosed embodiment includes: a substrate; a heating layer 111 on the substrate; a phase change layer 131 on and in contact with sidewall surface of the heating layer 111.

The substrate includes a first dielectric layer 100 and a first plug 101 located in the first dielectric layer 100. The first plug 101 is connected to the heating layer 111.

The phase change memory further includes a thermal insulation layer 121 located on the heating layer 111. The phase change layer 131 is also located on the thermal insulation layer 121. The phase change memory further includes a second dielectric layer 140 on the thermal insulation layer 121 and on the substrate; a second plug 102 located in the second dielectric layer 140. The second plug 102 is connected to the phase change layer 131.

In one embodiment, the phase change memory has the same structure as the phase change memory formed by the method of forming the phase change memory shown in FIGS. 2 to 10, and details will not be described here.

In the phase change memory provided by the disclosed embodiment, since the thickness of the heating layer is very small and the phase change layer is located on the sidewall surface of the heating layer, the contact area between the phase change layer and the heating layer is very small. The phase change layer has a small contact area with the heating layer, and only a small portion of the phase change layer undergoes phase change when reading and writing data. As such, the phase change time can be shortened, thereby increasing the read/write speed of the phase change memory.

Compared with conventional technologies, the fabrication method provided in the disclosure is advantageous.

As disclosed, a phase change layer is formed on the sidewall surface of the heating layer, and the thickness of the heating layer can be made very small, smaller than the minimum size of the surface of the heating layer, in the process of forming the heating layer. The thickness of the heating layer is very small, and the phase change layer is located on the sidewall surface of the heating layer. Further, only the sidewall of the heating layer is in contact with the phase change layer, and thus the contact area between the phase change layer and the heating layer is relatively small. Because the phase change layer has a small contact area with the heating layer, only a small portion of the phase change layer undergoes phase change when reading and writing data. As such, the phase change time can be shortened, thereby increasing the read/write speed of the phase change memory.

Further, removing a portion of the initial phase change layer on the sidewall surface of the heating layer can further reduce the contact area between the heating layer and the phase change layer, thereby further improving the reading and writing speed.

In the phase change memory provided in the disclosure, the thickness of the heating layer is small, and the phase change layer is located on the sidewall surface of the heating layer. Further, only the sidewall of the heating layer is in contact with the phase change layer, and the contact area between the phase change layer and the heating layer is small. Because the phase change layer has a small contact area with the heating layer, only a small portion of the phase change layer undergoes phase change when reading and writing data. As such, the phase change time can be shortened, thereby increasing the read/write speed of the phase change memory.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a phase change memory, comprising:
   providing a substrate;
   forming a heating layer on the substrate;
   forming a thermal insulation layer on the heating layer covering a top surface of the heating layer; and forming a phase change layer on the thermal insulation layer, the substrate, one sidewall surface of the thermal insulation layer and one sidewall surface of the heating layer, wherein in a cross-sectional view, the phase change layer completely covers a top surface of the thermal insulation layer and the one sidewall surface of the heating layer and is in direct contact with the one sidewall surface of the heating layer while exposing a remaining sidewall surface of the heating layer which is opposite the one sidewall surface of the heating layer; and forming a dielectric layer to encapsulate the heating layer, the thermal insulation layer and the phase change layer and in direct contact with the remaining sidewall surface of the heating layer.

2. The method according to claim 1, wherein forming the phase change layer comprises:

forming an initial phase change layer on the thermal insulation layer and on sidewall surfaces of the heating layer; and removing a portion of the initial phase change layer from the other remaining sidewall surface of the heating layer.

3. The method according to claim 2, wherein removing the portion of the initial phase change layer from the remaining sidewall surface of the heating layer comprises:

forming a patterned layer on the initial phase change layer, wherein:

the pattern layer exposes the portion of the initial phase change layer on the remaining sidewall surface of the heating layer, and the pattern layer and the heating layer are partially overlapped when being projected on the substrate; and using the patterned layer as a mask to etch the initial phase change layer to form the phase change layer.

4. The method according to claim 3, wherein:

using the patterned layer as the mask to etch the initial phase change layer includes one of a dry etching process and a wet etching process.

5. The method according to claim 1, wherein:

the thermal insulation layer is made of a material including silicon nitride.

6. The method according to claim 5, wherein:

forming the thermal insulation layer includes a chemical vapor deposition process.

7. The method according to claim 1, wherein:

the thermal insulation layer has a thickness in a range of about 600 angstroms to about 800 angstroms.

8. The method according to claim 1, wherein:

the heating layer is made of a material including titanium nitride, tantalum nitride, titanium, and tungsten; and forming the heating layer includes a physical vapor deposition process.

9. The method according to claim 1, wherein:

the phase change layer is made of a material including GeSbTe; and forming the phase change layer includes a physical vapor deposition process.

10. The method according to claim 1, wherein:

the heating layer has a thickness in a range of about 60 nm to about 80 nm.

11. The method according to claim 1, wherein:

a projected pattern of the heating layer on the substrate is rectangular or circular.

12. The method according to claim 1, wherein:

a projected pattern of the heating layer on the substrate is square, and a side length of the projected pattern of the heating layer on the substrate is in a range of about 270 nm to about 330 nm.

13. The method according to claim 1, further including:

forming a first plug in the substrate, wherein the first plug is connected to the heating layer; and forming a second plug on the phase change layer.

14. The method according to claim 1, wherein:

the phase change layer is in direct contact with the one sidewall surface of the thermal insulation layer while exposing the remailing sidewall surface of the insulation layer.

15. The method according to claim 1, wherein:

the top surface of the heating layer is insulated from the phase change layer by the thermal insulation layer.

16. A phase change memory, comprising:

a substrate;

a heating layer on the substrate;

a thermal insulation layer on the heating layer covering a top surface of the heating layer; and a phase change layer on the thermal insulation layer, the substrate, one sidewall surface of the thermal insulation layer and one sidewall surface of the heating layer, wherein in a cross-sectional view, the phase change layer completely covers a top surface of the thermal insulation layer and the one sidewall surface of the heating layer and is in direct contact with the one sidewall surface of the heating layer while exposing a remaining sidewall surface of the heating layer which is opposite the one sidewall surface of the heating layer; and a dielectric layer encapsulating the heating layer, the thermal insulation layer and the phase change layer and in direct contact with the remaining sidewall surface of the heating layer.

17. The phase change memory according to claim 16, wherein:

the thermal insulation layer is made of a material including silicon nitride.

18. The phase change memory according to claim 16, wherein:

the thermal insulation layer has a thickness in a range of about 600 angstroms to about 800 angstroms.

19. The phase change memory according to claim 16, wherein:

the heating layer has a thickness in a range of about 60 nm to about 80 nm.

20. The phase change memory of claim 16, wherein:

a projected pattern of the heating layer on the substrate is rectangular or circular.

* * * * *